(12) United States Patent
Kubo

(10) Patent No.: US 7,221,571 B2
(45) Date of Patent: May 22, 2007

(54) PACKAGE UNIT, PRINTED BOARD HAVING THE SAME, AND ELECTRONIC APPARATUS HAVING THE PRINTED BOARD

(75) Inventor: Hideo Kubo, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/332,287

(22) Filed: Jan. 17, 2006

(65) Prior Publication Data

US 2006/0113105 A1    Jun. 1, 2006

Related U.S. Application Data

(63) Continuation of application No. PCT/JP03/11014, filed on Aug. 28, 2003.

(51) Int. Cl.
*H05K 7/20* (2006.01)

(52) U.S. Cl. ............... 361/719; 361/704; 361/707; 257/712; 257/713

(58) Field of Classification Search ........... 361/707, 361/719–720, 704; 257/712–714
See application file for complete search history.

(56) References Cited

U.S. PATENT DOCUMENTS 4,323,914 A * 4/1982 Berndlmaier et al. ....... 257/713

6,162,663 A * 12/2000 Schoenstein et al. ....... 438/122
6,665,186 B1 * 12/2003 Calmidi et al. ............. 361/704
6,667,560 B2 * 12/2003 Goh .......................... 257/784

FOREIGN PATENT DOCUMENTS

| JP | 60-84848 | 5/1985 |
| JP | 63-185050 | 7/1988 |
| JP | 3-97993 | 10/1991 |
| JP | 5-102354 | 4/1993 |
| JP | 06053374 A * | 2/1994 |

OTHER PUBLICATIONS

Kawai et al., English translation of Japanese Patent 05-102354, Dated Apr. 1993.*

* cited by examiner

*Primary Examiner*—Michael Datskovsky
*Assistant Examiner*—Robert J. Hoffberg
(74) *Attorney, Agent, or Firm*—Staas & Halsey LLP

(57) ABSTRACT

A package unit to be mounted on an external printed board includes a package board mounted with an exoergic circuit element, a heat spreader that transmits heat from the exoergic circuit element to a heat sink that radiates the heat, a joining member that seals between the exoergic circuit element and the heat spreader, and forms a sealing space in cooperation with the exoergic circuit element and the heat spreader, and a liquid metal sealed in the sealing space.

19 Claims, 16 Drawing Sheets

PRIOR ART

PRIOR ART

PRIOR ART

PACKAGE UNIT, PRINTED BOARD HAVING THE SAME, AND ELECTRONIC APPARATUS HAVING THE PRINTED BOARD

This application is a continuation based on PCT International Application No. PCT/JP2003/11014, filed on Aug. 28, 2003, which is hereby incorporated by reference herein in its entirety as if fully set forth herein.

BACKGROUND OF THE INVENTION

The present invention relates generally to a fixture of a board, and more particularly to fixture of a package board having a heat radiator mechanism. The present invention is suitable, for example, for a fixture between a heat sink and a Ball Grid Array ("BGA"), a fixture between a heat sink and another package, such as Land Grid Array ("LGA") and Pin Grid Array ("PGA"). The present invention is also relates to a printed circuit board, such as a motherboard, mounted with such a package board, and an electronic apparatus, such as a server, equipped with the printed circuit board.

The recent developments of electronic apparatuses have increasingly demanded supplies of sophisticated and inexpensive electronic apparatuses. The BGA package has conventionally been proposed in order to meet this demand. The BGA package is one type of package board soldered to a printed board (which is also referred to as a system board and a motherboard). The BGA package realizes a narrower pitch and more pins (i.e., high-density leads) without enlarging the package size than a Quad Flat Package ("QFP") that has the Gullwing type leads on the four sides. Thus, the BGA package enhances the performance of and miniaturizes the electronic apparatus through the high density of the package.

The BGA package is mounted with an IC and an LSI that generally serve as a CPU, and the improved performance of the CPU swells the calorific value. Thus, in order to thermally protect the CPU, a radiator called a heat sink is thermally connected to the CPU via a heat spreader. The heat sink has cooling fins, is located near the CPU, and radiates the CPU through natural cooling.

Referring now to FIG. 12, a description will be given of the conventional BGA package. Here, FIG. 12 is a schematic sectional view for explaining a conventional BGA package 1000. As shown in FIG. 12, a ceramic package board 1400 that is equipped with an LSI 1100 via bumps 1200 and underfill 1300 is mounted on a printed board 1600 via BGA 1500. A heat sink (not shown) is thermally connected via a lid-structured heat spreader 1700. The LSI 1100 and the heat spreader 1700 are adhered to each other via a joining layer 1800.

The conventional BGA package 1000 thus mounts the LSI 1100 onto the ceramic package board 1400, because the LSI 1100 and ceramic have similar coefficients of thermal expansion enough to prevent the LSI 1100 and the package board 1400 from warping in mounting the LSI 1100. Although the package board 1400 directly contacts the underfill 1300, a difference of a coefficient of thermal expansion between the LSI 1100 and the package board 1400 is dominant due to a small thickness of the underfill 1300. This structure uses the package board 1400 and the LSI 1100 having almost the same coefficient of thermal expansion, and maintains very small the stress associated with the thermal expansions and contractions.

The heat spreader 1700 is adhered to the back of the LSI 1100 via the joining layer 1800. Even when the heat spreader 1700 is made of a material with a high thermal conductivity, such as Cu, the entire package cannot improve the heat transfer efficiency, because the joining layer 1800 needs such a joining material as resin and silicon adhesive agents having a low thermal conductivity or as a sheet or paste joining material, causing a temperature gap. While it is conceivable to use metal having a high thermal conductivity, such as solder, for the joining layer 1800, a difference of a coefficient of thermal expansion between the LSI 1100 and the heat spreader 1700 causes a strong thermal stress between them as the temperature of the LSI 1100 rises, causing damages of the joining layer 1800 and/or the LSI 1100.

Accordingly, use of liquid having a high thermal conductivity, such as liquid metal, for the joining layer 1800, is proposed to eliminate the thermal stress that would otherwise occur between the LSI 1100 and the heat spreader 1700, and to provide a BGA package having a high thermal conductivity (see, Japanese Patent Application, Publication No. 60-84848). FIGS. 13A to 13C are schematic sectional views for explaining a BGA package 2000 that uses the liquid metal for the joining layer. The BGA package 2000 is manufactured by etching an LSI 2100 shown in FIG. 13A to form a concave 2200 as shown in FIG. 13B, and then by injecting liquid metal 2300 into the concave 2200 and sealing the liquid metal 2300 by a heat-conductive coating 2400 that completely separates the liquid metal 2300 from the air and substrate, because the chemical characteristics of the liquid metal 2300 is likely to cause chemical reactions and erosions, such as hydroxylation and oxidation.

Another prior art proposes a BGA package structure that brings the top surface of the LSI into contact with the coolant and circulates the coolant.

For higher performance of the BGA package, use of resin for the package board instead of ceramic is studied. The resin board is thinner than the ceramic board, and expected to have a more improved electric characteristic than the ceramic board.

However, due to a difference of coefficient of thermal expansion between the resin package board and the LSI, the thermal stress occurs between them as the LSI's temperature rises. In particular, a difference of coefficient of thermal expansion between the resin package board and the LSI is so big that the LSI warps and the heat spreader adhered to the LSI's back surface also warps subject to the influence of warps between the LSI and the package board. Then, as shown in FIGS. 14A, 14B, and 15, the joining layer 1800 peels off, the LSI 1100 and the heat sink (not shown) are thermally disconnected to each other, and the LSI 1100 gets thermally damaged. Of course, physical damages are likely to occur in the LSI 1100, the joining layer 1800, and the heat spreader 1700 due to the warps of the LSI 1100. Here, FIGS. 14A and 14B are schematic sectional views of the BGA package 1000 for explaining the prior art problems, wherein the LSI is at a high temperature in FIG. 14A and the LSI is at a low temperature in FIG. 14B. FIG. 15 shows an enlarged sectional view showing a thermal disconnection between the LSI and the heat spreader due to the peeling off of the joining layer.

In addition, the BGA package that uses the liquid metal for the joining layer requires the fine processing technologies, such as etching, and high processing technologies, such as forming of the heat-conductive coating and sealing of the liquid metal. The heat-conductive coating as large as the LSI has no heat dispersion capability and the improved cooling capability for the LSI cannot be expected while its calorific value increases as its performance improves. Moreover, as described above, the difference of coefficient of thermal expansion between the resin package and the LSI may cause warps in the LSI and damages of the heat-conductive coating. An expansion of the liquid metal may also cause damages of the heat-conductive coating. One conceivable solution for the BGA package 2000 is to seal the liquid metal 2300 with the heat-conductive coating 2400, enclose the LSI 2100 with cooling fins 2500, and mount the integral structure onto a package board 2600, alleviating the damages of the heat-conductive coating 2400. However, this structure becomes big and complex. In addition, a joint between the heat-conductive coating 2400 and the heat sink 2500 remains problematic as to the thermal conductivity.

BRIEF SUMMARY OF THE INVENTION

Accordingly, it is an exemplified general object of the present invention to provide a package unit having a simple structure, a printed board having the same, and an electronic apparatus having the printed board, which can prevent damages of a joint between the package board and the LSI and a joint between the LSI and the heat spreader and improve the reliability.

A package unit according to one aspect of the present invention to be mounted on an external printed board includes a package board mounted with an exoergic circuit element, a heat spreader that transmits heat from the exoergic circuit element to a heat sink that radiates the heat, a joining member that seals between the exoergic circuit element and the heat spreader, and forms a sealing space in cooperation with the exoergic circuit element and the heat spreader, and a liquid metal sealed in the sealing space. This package unit thermally connects the exoergic circuit element to the heat spreader through the joining member and liquid metal sealed in the sealing space that is formed by the exoergic circuit element, the heat spreader, and the joining member. Therefore, this package unit shields the thermal stresses caused by the heat from the exoergic circuit element, and maintains a high thermal conductivity.

The joining member may connect the exoergic circuit element to the heat spreader along an outer circumference of the exoergic element, thereby minimizing the thermal stress applied to the joining member. The heat spreader may include a first member connected to the joining member, and a second member divided from the first member. The heat spreader may include a first member that has a bottom connected to the joining member, and a second member that is engaged with the first member and divided from the first member, the second member having a convex section with a convex facing the exoergic circuit element. Thereby, a simple structure can form a sealing structure that seals the liquid metal.

The bottom of the first member may serves as a flat spring with a thickness between 200 μm and 1 mm. The second member may have a notch in the convex, the notch permitting a thermal expansion of the liquid metal. Thereby, the stress concentration of the liquid metal can be mitigated. The joining member may be adhesive agent or solid metal.

The package unit may further include a permission part that permits a thermal expansion of the liquid metal. The permission part may be air sealed in the sealing space. The air may be inert gas that is selected among nitrogen, argon, and helium. The inert gas can prevent chemical reactions of the liquid metal. The permission part may be an elastic member provided in the sealing space. The heat spreader may have a convexoconcave shape on a surface that forms the sealing space. Thereby, the surface area of the heat spreader contacting the liquid metal increases. The heat spreader may be made of an elastic member. The package board may be mounted with plural exoergic circuit elements, and may be made of resin. As discussed above, in comparison with the ceramic board, the resin substrate reduces the cost, provides higher performance, and facilitates processing. In addition, the present invention is particularly effective when a difference of a coefficient of thermal expansion from the exoergic circuit element is big.

A printed board including the above package unit, and an electronic apparatus including the printed board constitute one aspect of the present invention.

A method according to another aspect of the present invention for manufacturing a package unit to be mounted on an external printed board, the package unit including a heat spreader that transmits heat from the exoergic circuit element mounted on a package board to a heat sink that radiates the heat, the heat spreader including a first member that is connected to the exoergic circuit element, and a second member that is engaged with the first member and forms a sealing space with the exoergic circuit element includes the steps of connecting the exoergic circuit element to the first member via the joining member, injecting a liquid metal between the exoergic circuit element and the first member connected by the connecting step, and engaging the second member with the first member and sealing the liquid metal injected by the injecting space in the sealing space. This manufacturing method can form a sealing structure that seals the liquid metal without high processing technology, and prevents a large size of the sealing structure.

A circuit unit according to another aspect of the present invention includes a circuit element, a board in which the circuit element is mounted thereon, a heat spreader provided over the circuit element that transmits heat generated by the circuit element, and a liquid metal filling a gap between the circuit element and the heat spreader. The circuit unit may further include a joining member that joins the circuit element and the heat spreader, forming the gap between the circuit element and the heat spreader. The circuit unit may further include a heat sink provided on the heat spreader for radiating heat transmitted to the heat spreader.

Other objects and further features of the present invention will become readily apparent from the following description of the embodiments with reference to accompanying drawings.

DETAILED DESCRIPTION OF THE INVENTION

Figure 1:
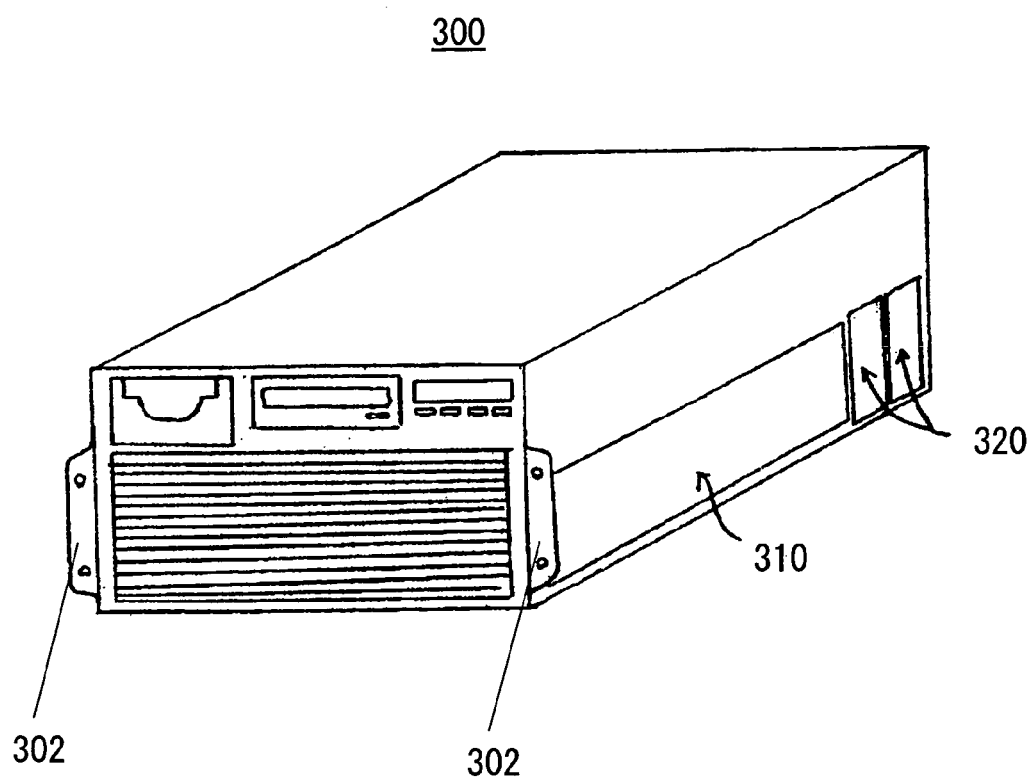
FIG. 1 is a schematic perspective view of an electronic apparatus according to the present invention.
Figure 2:
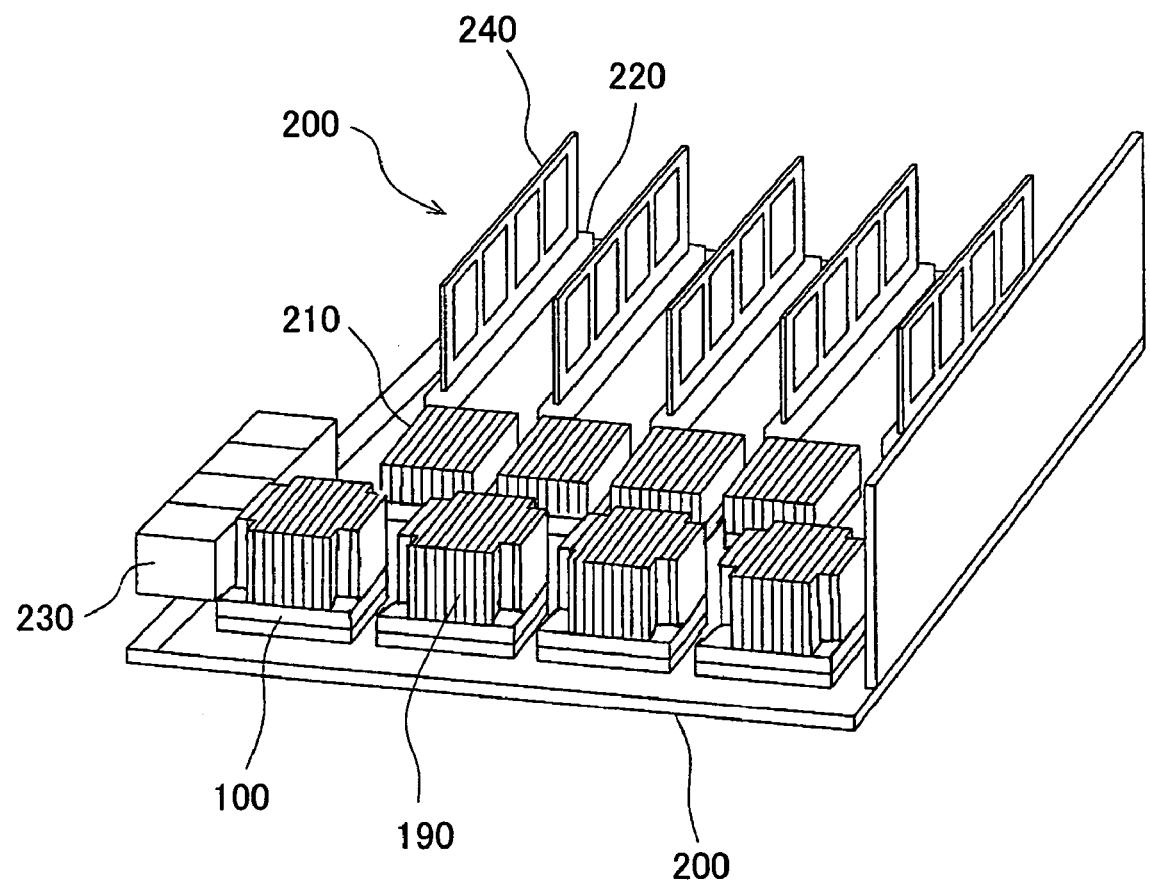
FIG. 2 is a schematic perspective view of an internal structure of the electronic apparatus shown in FIG. 1.

Referring now to accompanying drawings, a description will be given of a package module 100 as a package unit according to one embodiment of the present invention, a printed circuit board 200 mounted with the package module 100, and an electronic apparatus 300 that includes the printed circuit board 200. Here, FIG. 1 is a schematic perspective view of the electronic apparatus 300. FIG. 2 is a perspective overview of a system board as the printed circuit board 200 included in the electronic apparatus 300. In the following description, a reference numeral with no capital generalizes the reference numeral with a capital.

As shown in FIG. 1, the electronic apparatus 300 of the instant embodiment is exemplarily implemented as a rack mount type UNIX server. The electronic apparatus 300 is screwed onto a rack (not shown) by a pair of attachment parts 302, and includes the printed circuit board 200 shown in FIG. 2 in a housing 310.

The housing 310 is provided with a fan module 320, which rotates a built-in cooling fan to generate airflow and compulsorily cools a heat sink 190, to which a heat spreader 150 is connected which will be described later. The fan module 320 has a power section (not shown), and a propeller section (not shown) fixed onto the power section. The power section may use any structure known in the art, which typically includes a rotary shaft, a bearing around the rotary shaft, a bearing house, a magnet for a motor, etc., and a detailed description thereof will be omitted. The propeller section includes a number of angled, isogonally or non-isogonally arranged rotors, which have a predetermined size. The power section and the propeller section may or may not be separable.

As shown in FIG. 2, the printed circuit board 200 includes a package module 100, an LSI module 210 around the package module, a plurality of block plates 220 for receiving a plurality of memory cards 240, and a connector 230 for an external device, such as a hard disc drive ("HDD") and a LAN.

Figure 3:
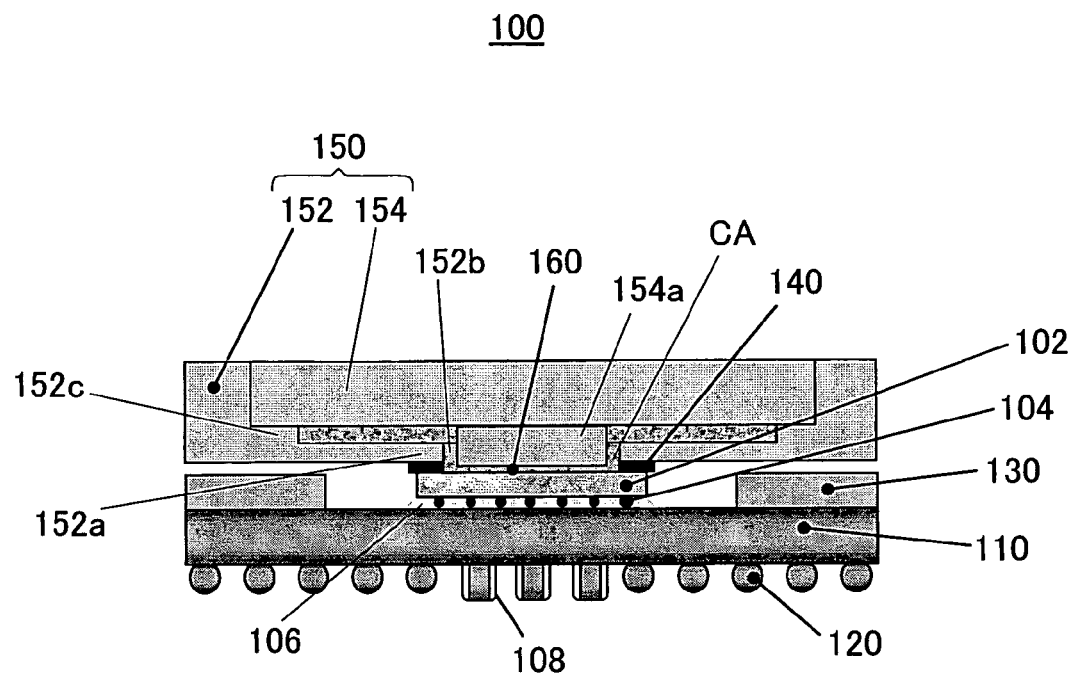
FIG. 3 is a schematic sectional view of a package module shown in FIG. 2.

The package module 100 serves as a BGA package that is mounted with a LSI 102 and connected to the printed circuit board 200 via BGA 120. More specifically, the package module 100 includes, as shown in FIGS. 2 and 3, a package board 110, BGA 120, reinforcing metal 130, a joining member 140, a heat spreader 150, liquid metal 160, and a heat sink 190. Here, FIG. 3 is a schematic sectional view of the package module 100 shown in FIG. 2, although FIG. 3 omits the heat sink 190.

The package board 110 is made, for example, of resin with a thickness of 500 μm to 1 mm. The resin board is thinner than, superior in electric characteristic to, less expensive than, and more easily processed than the ceramic board having a thickness of about 2 mm to 3 mm.

The package board 110 is mounted with the LSI 102 made of an LSI at its top surface and another circuit element 108, such as a capacitor, and the BGA 120 on its bottom surface. The package board 110 of this embodiment is a single chip type that mounts only one LSI 102.

While the package board 110 has a thickness of about 500 μm, the thickness of the underfill 106, which will be described later, is about 100 μm. Therefore, a difference in coefficient of thermal expansion between the package board 110 and the LSI 102 is more dominant than a difference in coefficient of thermal expansion between the package board 110 and the underfill 106.

The LSI 102 is an exoergic circuit element soldered to the package board 110 by bumps 104 as terminals, and resin underfill 106 that is usually used for a flip chip (or a chip that has bumps) is filled between the LSI 102 and the package board 110 to seal the bumps 104 and maintain connection reliability of the bumps 104.

The BGA 120 is a ball-shaped soldering bump (or a soldering ball), and arranged at a connection portion between the package board 110's bottom surface and the printed board 200. In other words, the BGA 120 serves as a terminal and is connected to the printed board 200 strongly by soldering balls (or solder). The BGA package thus uses the BGAs for connections instead of the leads provided at four sides of the QFP package. The BGA package can narrow the pitch between terminals, arrange many terminals, and realize the high density, high performance and miniaturization without enlarging the package. As in this embodiment, the BGA 120 may arrange soldering bumps in an approximately square shape having an approximately square hollow when there is the circuit element 108 on the bottom surface of the package board 110 or arrange soldering bumps on the entire bottom surface of the package board 110 when there is no circuit element 108.

The reinforcing metal 130 is provided on the top surface of the package board 110, and reinforces the package board 110. More specifically, the reinforcing metal 130 rectifies distortion of the package board 110. The reinforcing metal 130 is made, for example, of aluminum, copper, etc., and has an approximately square shape having an approximately square hollow. However, whether to provide the reinforcing metal 130 is optional.

The joining member 140 seals between the LSI 102 to the heat spreader 150, which will be described later, and serves to form a sealing space CA in cooperation with the LSI 102 and the heat spreader 150. The joining member 140 has a hollow, approximately rectangular shape pursuant to the outline of the LSI 102. The joining member 140 has a size of a height of 20 μm to 200 μm, and a width of about 2 mm to about 6 mm.

The joining member 140 is made of solid metal having a high thermal conductivity, such as copper and aluminum nitride, and connected to the LSI 102 and the heat spreader 150, which will be described later, around the LSI 102. In other words, the joining member 140 solid-joints or metal-joints the LSI 102 with the heat spreader 150. A limitation of the position of the joining member 140 to an outer circumference of the LSI 102 can minimize the load of the thermal stress to the LSI 102. Since the joining member 140 is made of a material having a high thermal conductivity, the joining member 140 never causes a temperature gap between the LSI 102 and the heat spreader 150, providing excellent heat transfers.

The joining member 140 may be an adhesive sheet or adhesive agent. The adhesive sheet and adhesive agent are used when the LSI 102's calorific value is small or when two adhered components (which are the package board 110 and the heat spreader 150) have similar coefficients of thermal expansion. This is because when there is a difference in coefficient of thermal expansion, the warp can eliminate the adhesion function or sealing effect of the sealing space CA.

The heat spreader 150 is arranged between the package board 110 and the heat sink 190, and connected to the LSI 102 via the joining member 140. The heat spreader 150 serves to transmit the heat from the LSI 102 to the heat sink 190, and is made of a material having a high coefficient of thermal conductivity, such as copper, aluminum carbide, aluminum, aluminum silicon carbide (aluminum that contains silicon), and silicon carbide.

The heat spreader 150 has two components, as shown in FIG. 3, including a first member 152 connected to the joining member 140, and a second member 154 divided from the first member 152, thereby forming the sealing space CA that seals the liquid metal 160, which will be described later, and preventing the large size of the sealing structure.

In the first member 152, a bottom 152a jointed with the joining member 140 has a square shape similar to that of the package board 110 with a hollow 152b. The hollow 152b is also a square shape pursuant to the outline of the joining member 140 (or LSI 102), and accommodates a convex 154a of the second member 154, which will be described later. However, the hollow 152b does not contact the convex 154a of the second member 154, but forms an aperture between the hollow 152b and the convex 154a and the aperture forms part of the sealing space CA.

The bottom 152a of the first member 152 includes an engagement part 152c engageable with or coupled to the second member 154. The engagement part 152c projects from the bottom 152a, and forms an aperture between the bottom 152a and the second member 154 when the engagement part 152c is engaged with the second member 154. This aperture forms part of the sealing space CA. Thereby, the surface area or volume of the sealing space CA expands, and the thermal conductivity improves. Since the sealing space CA requires a thickness of about 100 μm, the engagement part 152c preferably projects by about 100 μm from the bottom 152a.

The second member 154 has the convex 154a on the side of the LSI 102, thus forming a convex section. The convex 154a of the second member 154 has a height between about 0.5 mm and about 2.0 mm. The second member 154 is engaged with or connected to the first member 152 so that the convex 154a is accommodated in the hollow 152b. In other words, the second member 154 serves as a lid for the first member 152, defines the sealing space CA, and seals the liquid metal 160. Thereby, as described later, the sealing space CA has a simple sealing structure that seals the liquid metal 160 without relying upon the high processing technology.

Figure 9:
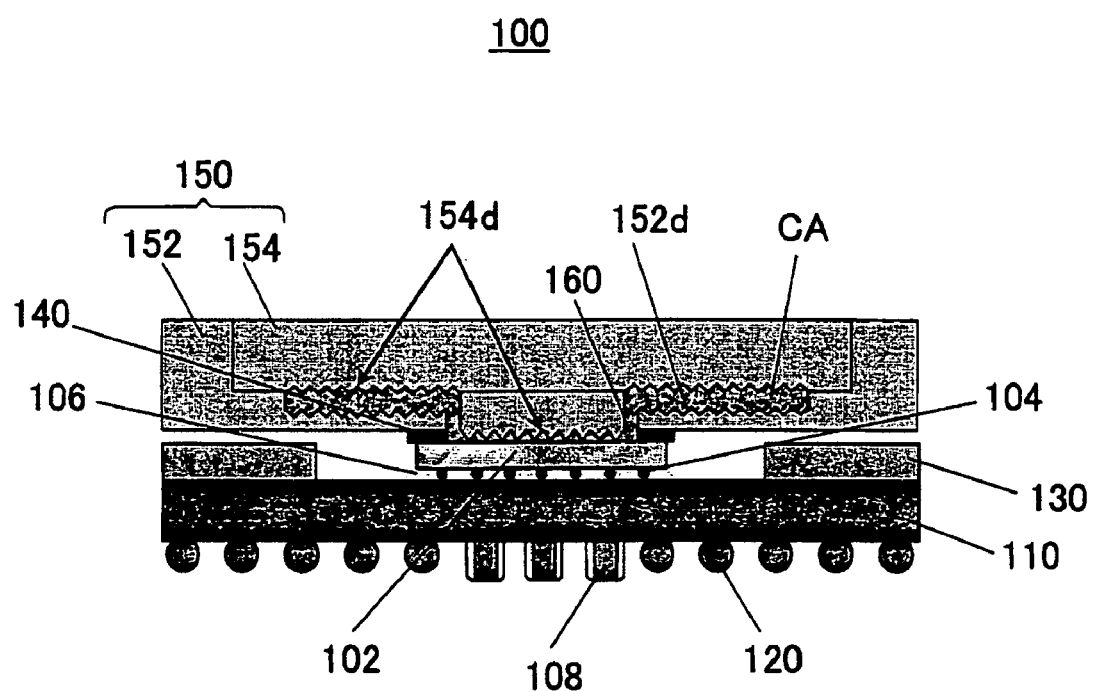
FIG. 9 is a schematic sectional view showing another example of a package module shown in FIG. 2.

The heat spreader 150 that has, as shown in FIG. 9, convexoconcave shapes 152d and 154d on its surfaces that form the sealing space CA (or contain the liquid metal 160) increases the surface area that contacts the liquid metal 160, which will be described later, and improve a coefficient of thermal expansion. Here, FIG. 9 is a schematic sectional view of the package module 100 that includes the heat spreader 150 having the convexoconcave shapes 152d and 154d.

The liquid metal 160 is sealed in the sealing space CA that is cooperatively formed by the LSI 102, the joining member 140 and the heat spreader 150. The liquid metal 160 is metal, such as indium and potassium, which is liquid at the room temperature, and serves to connect, with a high thermal conductivity, the LSI 102, the heat spreader 150 and the first member 152 and the second member 154 of the heat spreader 150.

The liquid metal 160 is completely separated from the package board 110 and the external air, to prevent its chemical reactions, such as oxidation and hydroxylation, caused by its chemical characteristics. Thereby, the liquid metal 160 prevents its thermal conductivity from lowering due to erosions, and maintains its thermal conductivity.

The liquid metal 160 has fluidity, and absorbs the thermal stress caused by the difference in coefficient of thermal expansion between the LSI 102 and the heat spreader 150. The liquid metal 160 serves to shield the thermal stress of the LSI 102. For example, even when the LSI 102 warps due to the difference in coefficient of thermal expansion between the LSI 102 and the heat spreader 150, the fluidal liquid metal 160 does not transmits the warp to the heat spreader 150, preventing damages of the heat spreader 150. The liquid metal 160 does not get damages due to the warps of the LSI 102, maintaining a thermal connection between the heat spreader 150 (and the heat sink 190) and the LSI 102.

The heat sink 190 has a base and cooling fins. The base is a plate composed, for instance, of aluminum, copper, aluminum nitride, artificial diamond, plastic, or other materials of high thermal conductivity, and joined to the heat spreader 150. The heat sink 190 is manufactured by sheet metal working, aluminum die casting, or other processes and, if made of plastic, may be formed, for example, by injection molding. The cooling fins include many aligned plate-shaped fins, and form a convex portion to increase a surface area thereof, thereby enhancing dissipating effects. However, the shape of the cooling fin is not limited to one like a plate, and any arrangement shapes like a pin, a curve, etc. may be adopted. The cooling fins do not necessarily have to be aligned horizontally at a regular interval, but may be placed radially or obliquely with respect to the base. Moreover, the number of the cooling fins may be arbitral. The cooling fins are preferably made of a material of high thermal conductivity, such as aluminum, copper, aluminum nitride, artificial diamond, and plastic. The cooling fins are formed by molding, a press fit, brazing, welding, injection molding, or the like.

Figure 4:
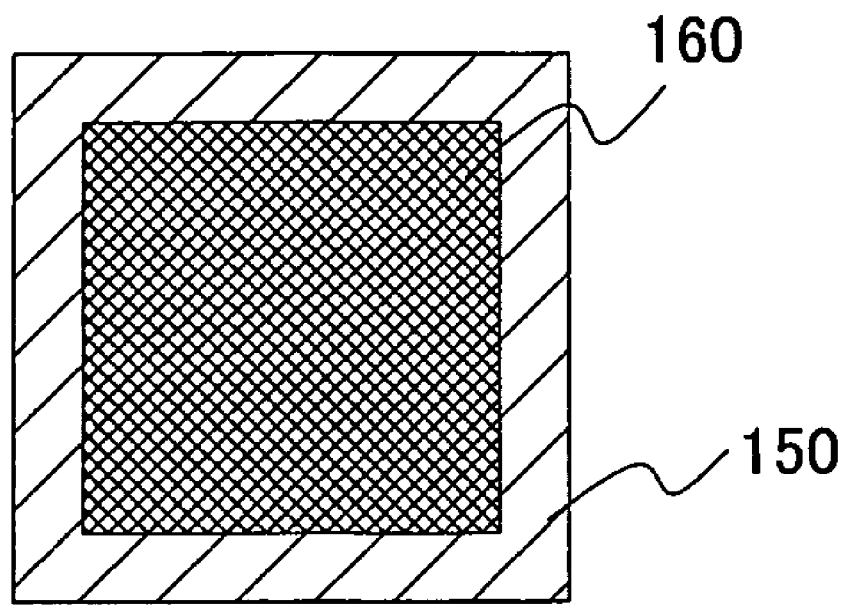
FIG. 4 is a schematic top view showing a connection state of an LSI with a heat spreader in the package module shown in FIG. 3.
Figure 12:
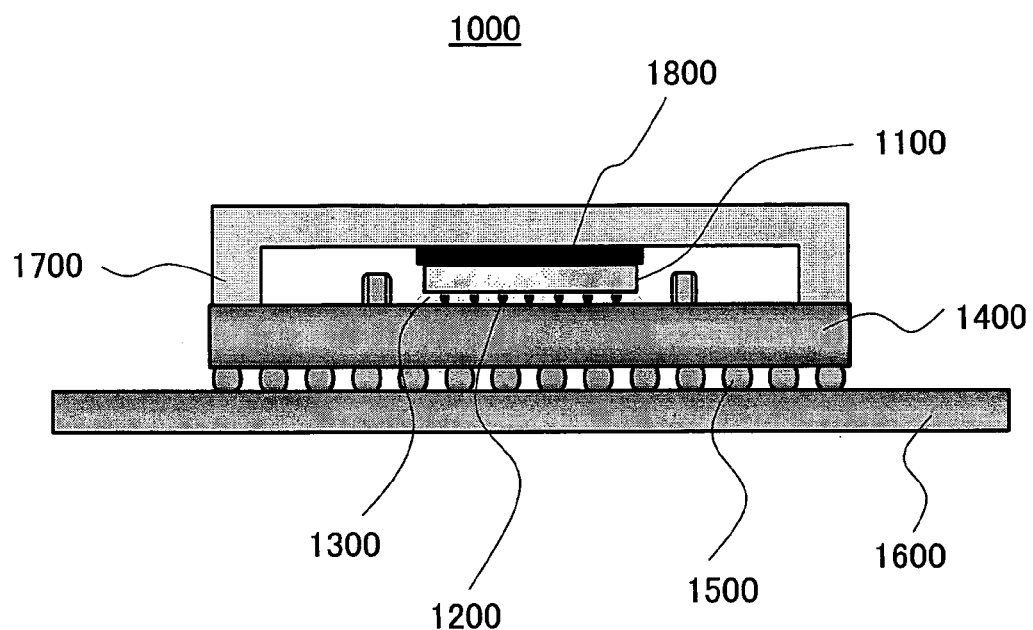
FIG. 12 is a schematic sectional view for explaining a conventional BGA package.
Figure 13A:
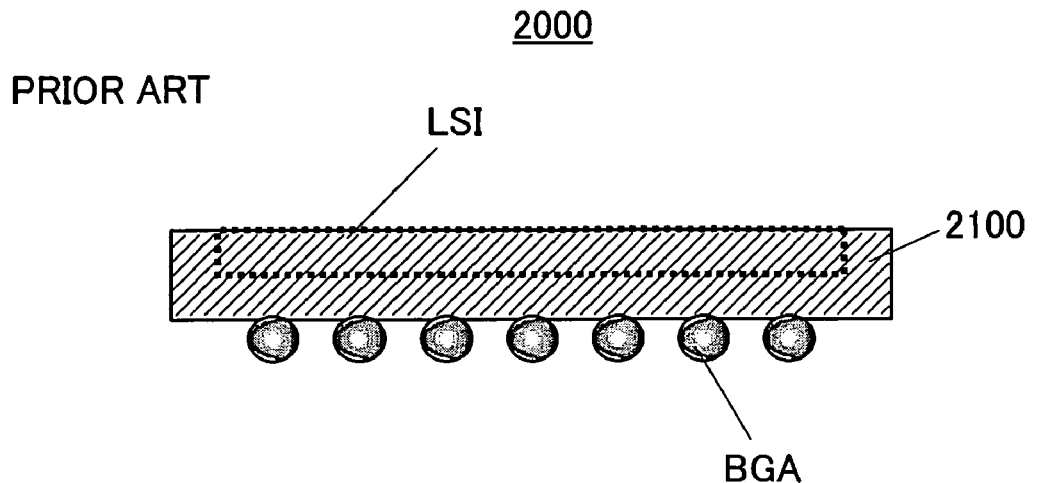
FIGS. 13A–13C are schematic sectional views for explaining a manufacture of the BGA package that uses liquid metal for a joining layer.
Figure 13B:
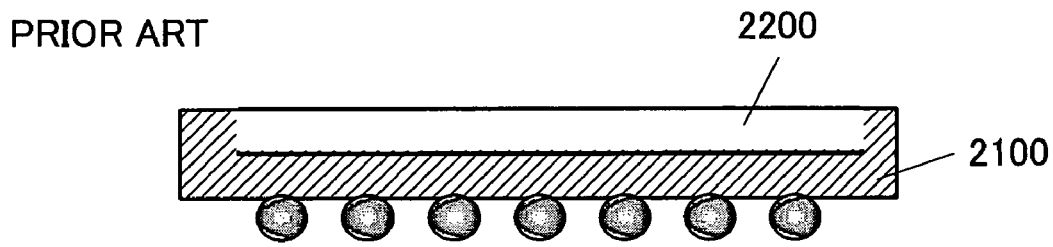
Figure 13C:
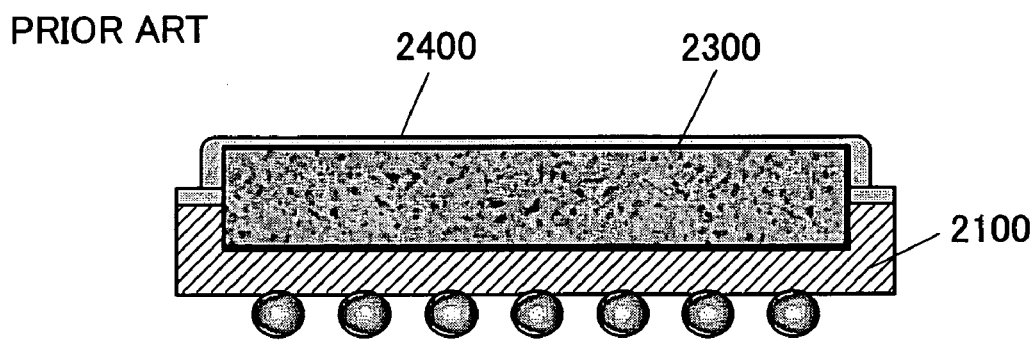
Figure 14A:
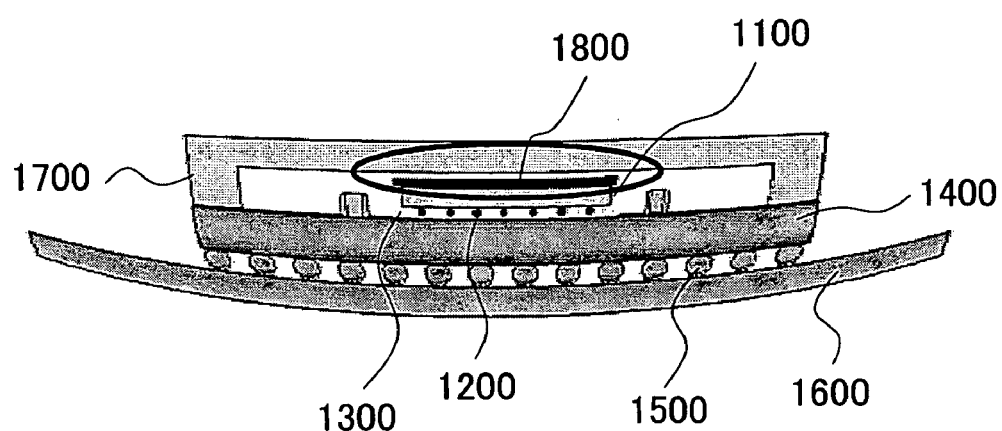
FIGS. 14A and 14B are schematic sectional views showing problems of the conventional BGA package.
Figure 14B:
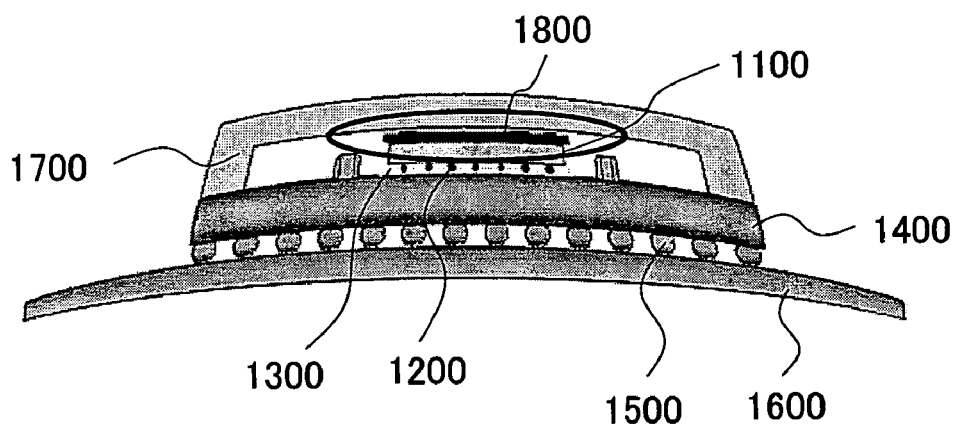
Figure 15:
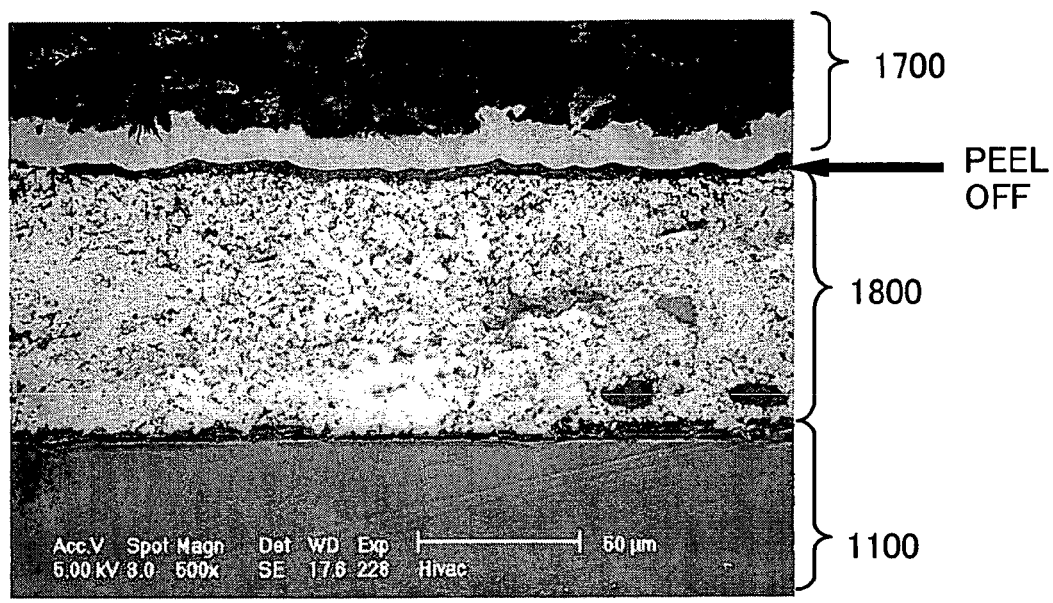
FIG. 15 is an enlarged sectional view showing a thermal disconnection state between the LSI and heat spreader due to the peeling off.
Figure 16:
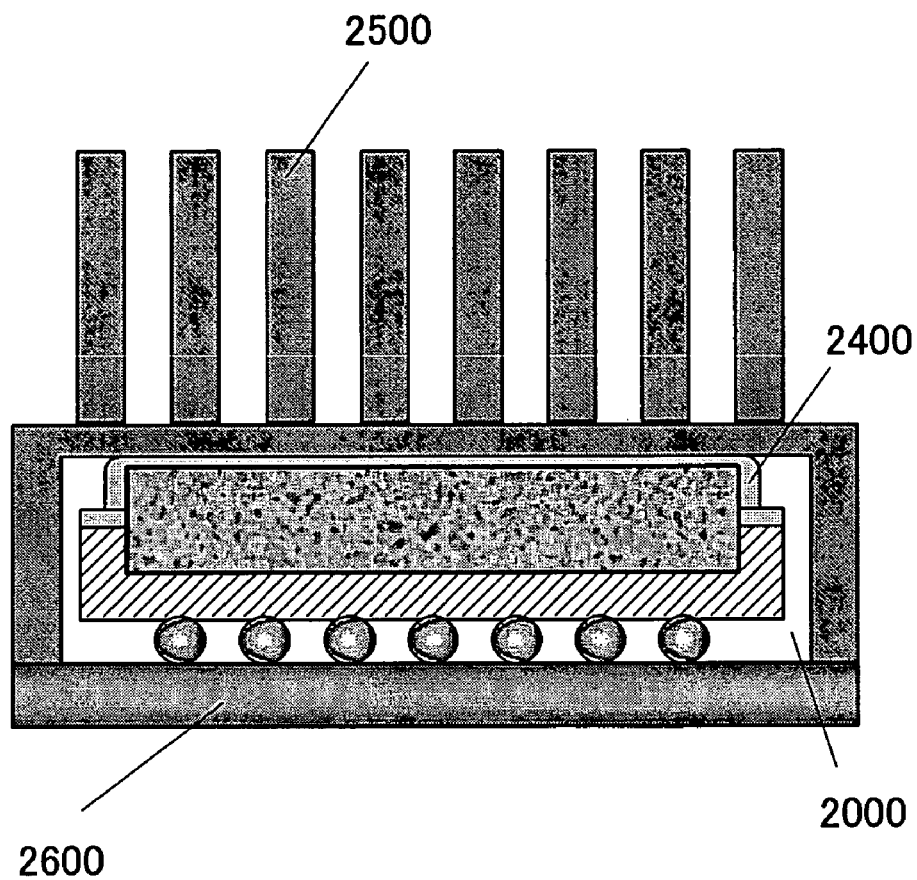
FIG. 16 is a schematic sectional view of the BGA package shown in FIGS. 13A to 13C integrated with cooling fins.

In the package module 100, the heat spreader 150 is separated from the package board 110, unlike the lid-type heat spreader 1700 in the conventional BGA package 1000 shown in FIG. 12. The package module 100 connects, as shown in FIG. 4, the LSI 102 to the heat spreader 150 via the joining member 140 and the liquid metal 160, and maximizes their excellent features or high heat conductivities while redeeming disadvantages between the solid joint and the liquid joint. Thereby, the package module 100 can maintain the thermal and physical jointing states without a thermal disconnection between the LSI and heat spreader due to the peeling off of the joining layer. For example, the joining part has thermal resistance of about 0.2° C./W in the conventional BGA package, whereas the package module 100 of this embodiment reduces the thermal resistance of the joining part by one-tenth or down to about 0.02° C./W, improving the heat transfer efficiency. Here, FIG. 4 is a schematic top view showing a connection state of the LSI 102 with the heat spreader 150 in the package module 100 shown in FIG. 3.

The liquid metal 160 can thermally expand due to the heat of the LSI 102. The thermally expanding liquid metal 160 compresses the LSI 102, joining member 140, and heat spreader 150, and may cause damages or thermal disconnections among them. Accordingly, the package module 100 is provided with a permission part 170, also identified as 170A in FIG. 5, 170B in FIG. 6 and 170C in FIG. 7, that permits a thermal expansion of the liquid metal 160.

Figure 5:
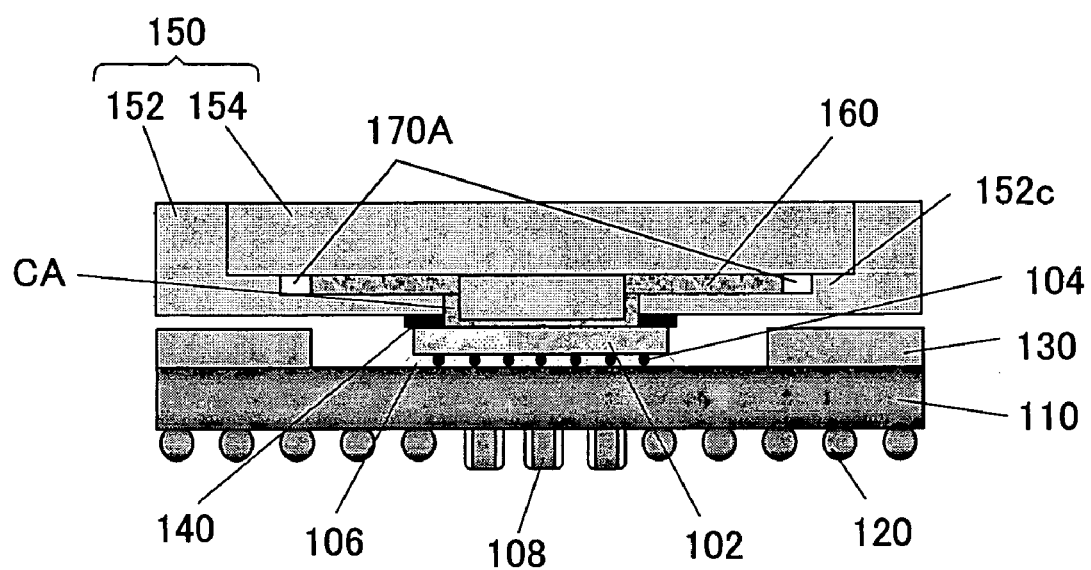
FIG. 5 is a schematic sectional view showing one example of the package module shown in FIG. 2.

One example of the permission part 170 is implemented by the air layer 170A sealed in the sealing space CA, as shown in FIG. 5. The air 170A is so elastic that it can buffer the thermal expansion of the liquid metal 160, thereby preventing damages or thermal disconnections among the LSI 102, joining member 140, and heat spreader 150. Although FIG. 5 shows the air 170A near the engagement part 152c of the first member 152, the air 170A may exist anywhere in the sealing space CA as long as it buffers the thermal expansions of the liquid metal 160 since the air 170A can move in the liquid metal 160. Here, FIG. 5 is a schematic sectional view of the package module 100 that has the permission part 170A.

The air 170A is, for example, inert gas, such as nitrogen, argon, and helium. Thus, the air 170A sealed in the sealing space CA does not cause chemical reactions of the liquid metal 160, such as oxidation and hydroxylation, and maintains the high thermal conductivity. The necessary volume of the air 170A for this purpose is about 3 cc.

Figure 6:
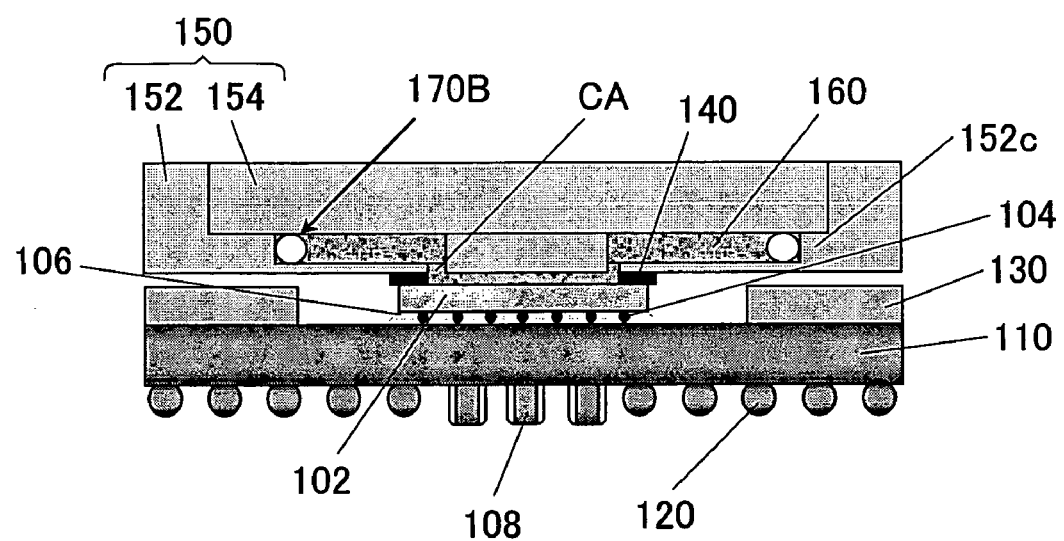
FIG. 6 is a schematic sectional view showing another example of the package module shown in FIG. 2.

Another example of the permission part 170 is implemented as an elastic member 170B provided in the sealing space CA, as shown in FIG. 6. The elastic member 170B is so elastic that it can buffer the thermal expansion of the liquid metal 160, thereby preventing damages or thermal disconnections among the LSI 102, joining member 140, and heat spreader 150. Although FIG. 6 shows the elastic member 170B near the engagement part 152c of the first member 152, the elastic member 170B may exist anywhere in the sealing space CA as long as it buffers the thermal expansions of the liquid metal 160. The elastic member 170B is made, for example, of buffer rubber or gel, such as an O-ring. The elastic member 170B has a size of a diameter $\Phi$ of about 20 mm to about 30 mm, a section $\Phi$ of about 0.5 mm to about 1.0 mm. The elastic member 170B made of a halogen material in the sealing space CA does not cause chemical reactions of the liquid metal 160, such as oxidation and hydroxylation, and maintains the high thermal conductivity. Here, FIG. 5 is a schematic sectional view of the package module 100 that has the permission part 170B.

Figure 7:
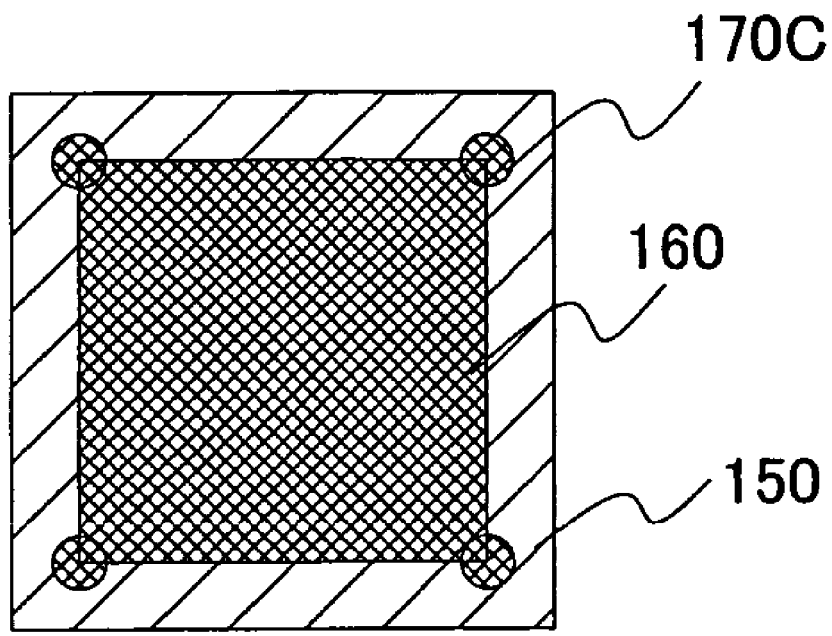
FIG. 7 is a schematic top view showing another connection state of the LSI shown in FIG. 4 with the heat spreader.

Still another example of the permission part 170 is implemented as arc notches 170C provided in the convex 154c of the second member 154, as shown in FIG. 7. The notch 170C can buffer the thermal expansion of the liquid metal 160, thereby preventing damages or thermal disconnections among the LSI 102, joining member 140, and heat spreader 150. The notch 170C needs a diameter $\Phi$ of about 2 mm to about 4 mm. The notches 170C formed at four corners of the convex 154c of the second member 154 can mitigate the stress concentration of the liquid metal 160. Here, FIG. 7 is a schematic top view showing another connection state of the LSI 102 with the heat spreader 150.

Figure 8:
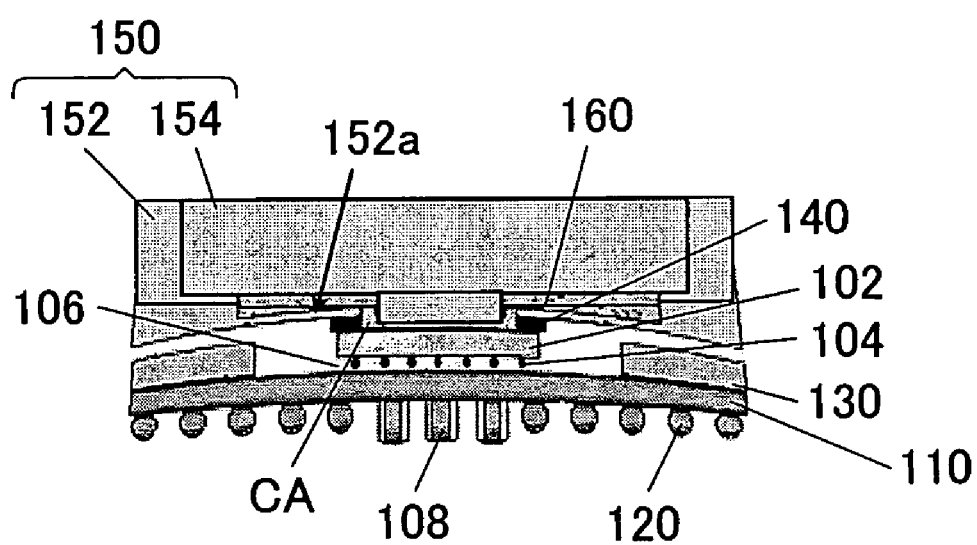
FIG. 8 is a schematic sectional view showing still another example of a package module shown in FIG. 2.

The LSI 102 and the package board 110 can deform or bend due to the thermal stresses, and may cause peeling off of the joining member 140, damages of the heat spreader 150, and finally thermal disconnections. One solution for these problems associated with the deformations due to the thermal stresses of the LSI 102 and the package board 110 is to make the bottom 152a of the first member 152 of foil as shown in FIG. 8. The bottom 152a of the first member 152 that serves as a flat spring function can absorb deformations of the LSI 102 and the package board 110, preventing peeling off of the joining member 140 and damages of the heat spreader 150. In order to provide the bottom 152a of the first member 152 with the flat spring function, the bottom 152a preferably has a thickness from 200 µm to 1 mm. When the thickness of the bottom 152a is smaller than 200 µm, the pressure of the liquid metal 160 cannot sufficiently seal the sealing space CA. When the thickness of the bottom 152a is greater than 1 mm the flat spring function is unavailable. Here, FIG. 8 is a schematic sectional view of the package module 100 in which the bottom 152a of the first member 152 serves as a flat spring and absorbs the deformations of the LSI 102 and the package board 110.

Moreover, the heat spreader 150 that is made elastic can absorb the thermal expansions of the liquid metal 160 and the deformations due to the thermal stresses of the LSI 102 and the package board 110.

Figure 10:
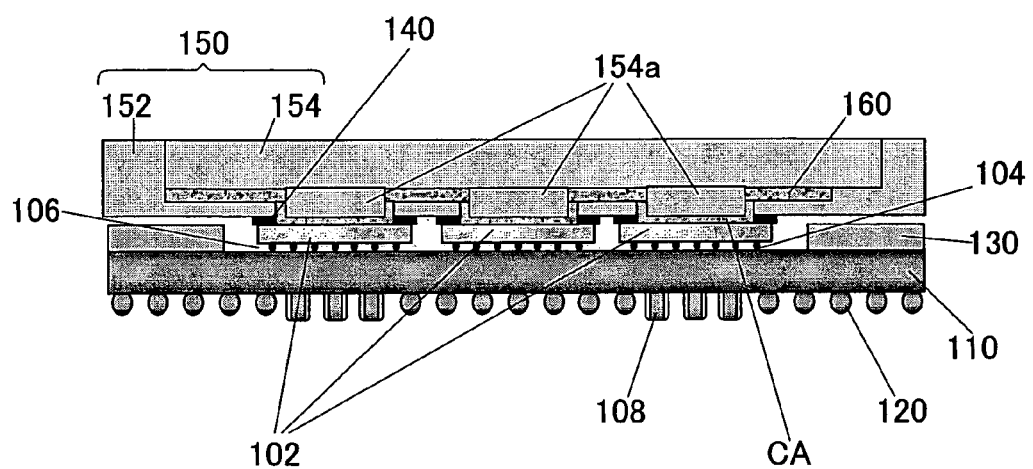
FIG. 10 is a schematic sectional view of a package module having a multi-chip package board.

While the above embodiment describes a single chip type package board 110 that is mounted with one LSI 102, the present invention is applicable to a multi-chip type package 10A that is mounted with plural LSIs 102. In this case, plural hollows 152b of the first member 152 and plural convexes 154a of the second member 154 may be provided for the plural LSIs 102. Here, FIG. 10 is a schematic sectional view of the package module having the multi-chip package board 110A.

Figure 11:
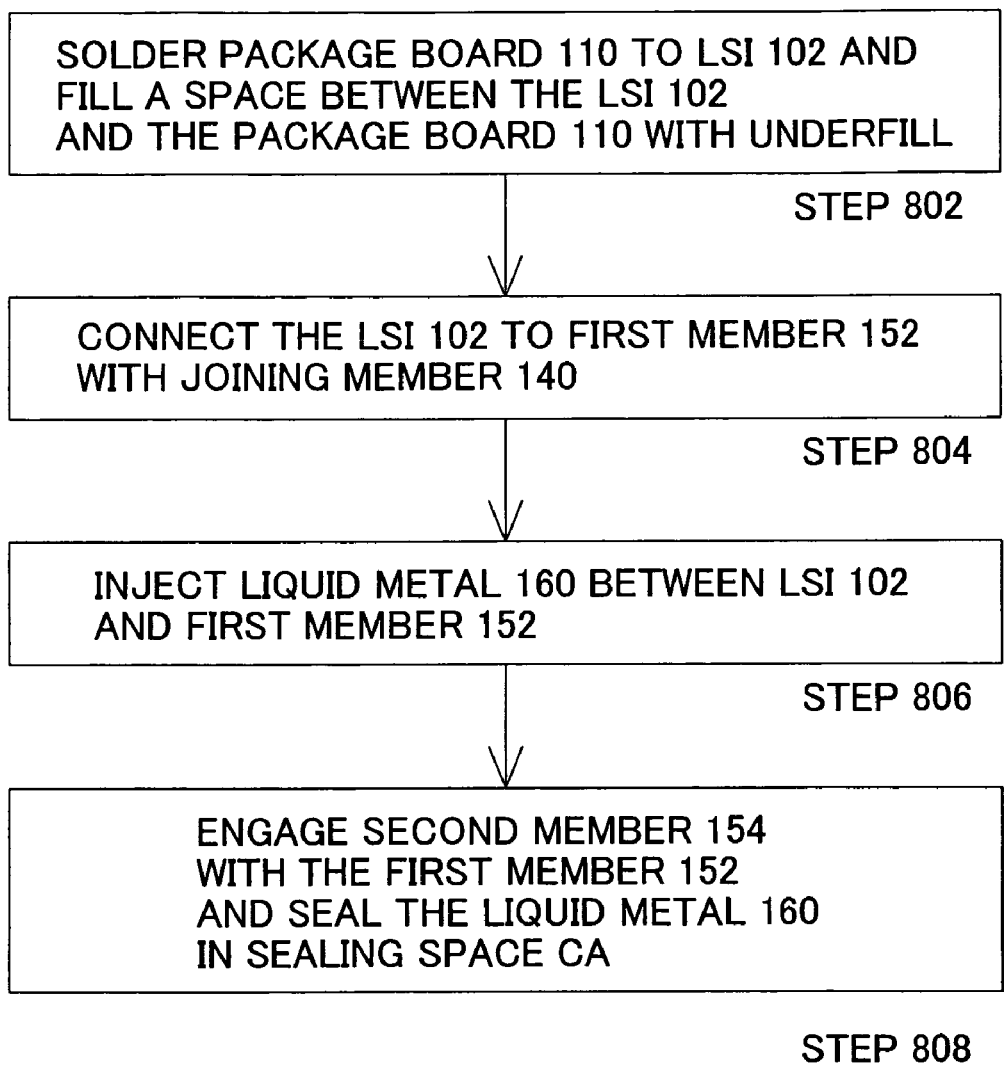
FIG. 11 is a flowchart for explaining an inventive package module manufacturing method.

Referring now to FIG. 11, a description will now be given of a manufacturing method 800 of the package module 100. Here, FIG. 11 is a flowchart for explaining the manufacturing method 800 of the package module 100 according to the present invention.

First, the LSI 102 is soldered onto the package board 110 via the bumps 104, and the underfill 106 is filled between the LSI 102 and the package board 110 (step 802). Next, the first member 152 of the heat spreader 150 is connected to the LSI 102 via the joining member 140 (step 804) while the joining member 140 is provided along the outer circumference L102 as described above.

Next, the liquid metal 160 is injected by an amount that fills the formed sealing space CA (or by the volume of the sealing space CA) between the LSI 102 and the first member 152 connected by the step 804 (step 806). Then, the second member 154 of the heat spreader 150 is engaged with the first member 152, sealing the liquid metal 160 injected in the step 806 in the sealing space CA (step 808).

This manufacturing method 800 can manufacture the package module 100 that seals the liquid metal 160 in the sealing space CA without requiring a high degree of processing technology or fine processing technology for etching etc. In addition, since the LSI 102, the joining member 140, and the heat spreader 150 cooperatively forms the sealing space CA, the sealing structure does not become big and maintains the small size of the electronic apparatus 300.

In operation, the electronic apparatus 300 uses the package board 110 and thus is less expensive, and is so thin that it provides high electric characteristics with few noises. The liquid metal 160 sealed in the sealing space CA formed by the LSI 102, the joining member 140 and the heat spreader 150 prevents the thermal disconnection caused by the thermal stresses between the LSI 102 and the heat spreader 150, and maintains a high thermal conductivity. The heat generated from the LSI 102 properly radiated by the heat sink 190. The cooling fins of the heat sink 190 are cooled by the cooling fan installed in the fan module 320. Therefore, the electronic apparatus 300 maintains the operational stability of the LSI 102, and the separable structure of the heat spreader 160 realizes a simple and small sealing structure that seals the liquid metal 160.

Further, the present invention is not limited to these preferred embodiments, and various modifications and changes may be made in the present invention without departing from the spirit and scope thereof. For example, the inventive electronic apparatus is not limited to a rack mount type server, but is applicable to a bookshelf type. It is not limited to a server, and is applicable to a PC, a network device, a PDA, and other peripherals. The inventive package module is applicable to a Land Grid Array ("LGA") package that is connected to a printed board via a LGA socket. Moreover, the inventive package module is applicable to an exoergic element that does not serve as a CPU, such as a chipset.

Thus, the present invention can provide a package unit having a simple structure, a printed board having the same, and an electronic apparatus having the printed board, which can prevent damages of a joint between the package board and the LSI and a joint between the LSI and the heat spreader and improve the reliability.

What is claimed is:

1. A package unit to be mounted on an external printed board, said package unit comprising: a package board mounted with an exoergic circuit element; a heat spreader that transmits heat from the exoergic circuit element to a heat sink that radiates the heat, said heat spreader including a first member and a second member divided from the first member; a joining member connected to the first member, forming a seal between the exoergic circuit element and said first member, and forming a sealed space in cooperation with the exoergic circuit element and said heat spreader; and a liquid metal in the sealed space, the sealed space extending between the first member and the second member, a portion of the first member contacting the liquid metal serving as a flat spring.

2. The package unit according to claim 1, wherein said joining member connects the exoergic circuit element to said heat spreader along an outer circumference of the exoergic element.

3. The package unit according to claim 1, wherein said second member has a convex section facing the exoergic circuit element.

4. The package unit according to claim 1, wherein the part of the first member has a thickness between 200 μm and 1 mm.

5. The package unit according to claim 1, wherein said joining member is adhesive agent or solid metal.

6. The package unit according to claim 1, further comprising a permission part that permits thermal expansion of the liquid metal.

7. The package unit according to claim 6, wherein the permission part is air sealed in the sealed space.

8. The package unit according to claim 7, wherein the permission part is inert gas that is selected among nitrogen, argon, and helium.

9. The package unit according to claim 6, wherein the permission part is an elastic member provided in the sealed space.

10. The package unit according to claim 1, wherein said heat spreader has a convexoconcave shape on a surface that forms the sealed space.

11. The package unit according to claim 1, wherein said heat spreader is elastic.

12. The package unit according to claim 1, wherein said package board is mounted with plural exoergic circuit elements.

13. The package unit according to claim 1, wherein said package board is made of resin.

14. A printed board comprising a package unit mounted on said printed board, said package unit comprising: a package board mounted with an exoergic circuit element; a heat spreader that transmits heat from the exoergic circuit element to a heat sink that radiates the heat, said heat spreader including a first member and a second member divided from the first member; a joining member connected to the first member, forming a seal between the exoergic circuit element and said first member, and forming a sealed space in cooperation with the exoergic circuit element and said heat spreader; and a liquid metal in the sealed space, the sealed space extending between the first member and the second member, a portion of the first member contacting the liquid metal serving as a flat spring.

15. An electronic apparatus comprising a printed board mounted with a package unit, said package unit comprising: a package board mounted with an exoergic circuit element; a heat spreader that transmits heat from the exoergic circuit element to a heat sink that radiates the heat, said heat spreader including a first member and a second member divided from the first member; a joining member connected to the first member, forming a seal between the exoergic circuit element and said first member, and forming a sealed space in cooperation with the exoergic circuit element and said heat spreader; and a liquid metal in the sealed space, the sealed space extending between the first member and the second member, a portion of the first member contacting the liquid metal serving as a flat spring.

16. A package unit to be mounted on an external printed board, said package unit comprising:
   a package board mounted with an exoergic circuit element;
   a heat spreader that transmits heat from the exoergic circuit element to a heat sink that radiates the heat, said heat spreader including a first member and a second member divided from the first member;
   a joining member connected to the first member, forming a seal between the exoergic circuit element and said first member, and forming a sealed space in cooperation with the exoergic circuit element and said heat spreader; and
   a liquid metal in the sealed space, the sealed space extending between the first member and the second member, a portion of the first member contacting the liquid metal being flexible.

17. A package unit to be mounted on an external printed board, said package unit comprising: a package board mounted with an exoergic circuit element; a heat spreader that transmits heat from the exoergic circuit element to a heat sink that radiates the heat, said heat spreader including a first member and a second member divided from the first member and having a convex section facing the exoergic circuit element, the second member having a notch in the convex section, permitting a thermal expansion of a liquid metal; a joining member that is connected to the first member, forming a seal between the exoergic circuit element and said first member, and forming a sealed space in cooperation with the exoergic circuit element and said heat spreader; and the liquid metal sealed in the sealed space.

18. A printed board comprising a package unit mounted on said printed board, said package unit comprising: a package board mounted with an exoergic circuit element; a heat spreader that transmits heat from the exoergic circuit element to a heat sink that radiates the heat, said heat spreader including a first member and a second member divided from the first member and having a convex section facing the exoergic circuit element, the second member having a notch in the convex section, permitting thermal expansion of a liquid metal; a joining member that is connected to the first member, forming a seal between the exoergic circuit element and said first member, and forming a sealed space in cooperation with the exoergic circuit element and said heat spreader; and the liquid metal sealed in the sealed space.

19. An electronic apparatus comprising a printed board mounted with a package unit, said package unit comprising: a package board mounted with an exoergic circuit element; a heat spreader that transmits heat from the exoergic circuit element to a heat sink that radiates the heat, said heat spreader including a first member and a second member divided from the first member and having a convex section facing the exoergic circuit element, the second member having a notch in the convex section, permitting thermal expansion of a liquid metal; a joining member that is connected to the first member, forming a seal between the exoergic circuit element and said first member, and forming a sealed space in cooperation with the exoergic circuit element and said heat spreader; and the liquid metal sealed in the sealed space.

* * * * *